United States Patent

Huh et al.

[11] Patent Number: 5,877,068
[45] Date of Patent: Mar. 2, 1999

[54] METHOD FOR FORMING ISOLATING LAYER IN SEMICONDUCTOR DEVICE

[75] Inventors: Ki Jae Huh, Chungcheongbuk-do; Jeong Hwan Son, Daejen-si, both of Rep. of Korea

[73] Assignee: LG Semicon Co., Ltd., Chungcheongbuk-Do, Rep. of Korea

[21] Appl. No.: 784,062

[22] Filed: Jan. 17, 1997

[30] Foreign Application Priority Data

Aug. 30, 1996 [KR] Rep. of Korea ............................ 37021

[51] Int. Cl.⁶ .................................................... H01L 21/76
[52] U.S. Cl. ......................... 438/439; 438/225; 438/297; 438/456
[58] Field of Search .................... 438/439, 297, 438/224, 225, 452

[56] References Cited

U.S. PATENT DOCUMENTS 5,612,247  7/1995  Itabashi ................................ 438/439
5,700,733  6/1975  Manning ............................... 438/439

OTHER PUBLICATIONS

Stanley Wolf, Ph.D., Silicon Processing for The VLSI Era, vol. 2, Process Integration, pp. 35–38, 1989.

POP–SILO, Ext.Abs Spring Meeting–Electrochem, Soc. 1988, p. 205.

*Primary Examiner*—Charles Bowers
*Assistant Examiner*—David S. Blum
*Attorney, Agent, or Firm*—Morgan, Lewis & Bockius LLP

[57] ABSTRACT

A method for forming an isolating layer in a semiconductor device includes the steps of forming a first material layer on an active layer having a major axis and a minor axis, forming a second material layer in a form of sidewall at sides of the first material layer in a direction of the major axis, and conducting field oxidation using the first and second material layers as masks to form the isolating layer.

19 Claims, 7 Drawing Sheets minor axis direction(A-A')

major axis direction(B-B')

minor axis direction portions photo resist layers are formed portions nitride side walls are formed a portion a nitride layer is formed major axis direction | minor axis direction

METHOD FOR FORMING ISOLATING LAYER IN SEMICONDUCTOR DEVICE

BACKGROUND OF THE INVENTION

1. Field of the Invention

The present invention relates to a semiconductor device, and more particularly, to a method for forming an isolating layer in a semiconductor device.

2. Discussion of the Related Art

In general, during the fabrication of a semiconductor device, an active region having actual cells formed therein and a device isolating region for isolating the cells formed in the active region are formed on a semiconductor substrate. As the trend of high density semiconductor device packing continues, the securing of the active region with an accurate profile within the limited area of the substrate becomes increasingly important in semiconductor device fabrication. The most widely used technique in isolating the devices is the local oxidation of silicon (LOCOS) method.

A conventional method for forming a device isolating layer in a semiconductor device will now be explained with reference to the attached drawings. FIGS. 1a~1d are sectional views showing the steps of a LOCOS process.

Referring to FIG. 1a, a buffer oxide film 2 is formed on a semiconductor substrate (P-sub) 1, and a non-oxidizable nitride film 3 is formed on the buffer oxide film 2. As shown in FIG. 1b, a photoresist 4 is coated on the nitride film 3 and patterned to leave the photoresist 4 only on an active region, thereby defining the active region and the device isolating region. Then, the nitride film 3 and the buffer oxide film 2 are selectively removed using the patterned photoresist 4 as a mask. impurities ($B^+$) having the same conductivity type as that of the semiconductor substrate 1 are injected into the device isolating region having the nitride film 3 and the buffer oxide film 2 removed therefrom. As shown in FIGS. 1c and 1d. a field oxide film is formed as a device isolating layer 5 in the device isolating region using the nitride film 3 as a mask. The nitride film 3 is then removed. During the formation of the device isolating layer 5, bird's beaks occur where the field oxide film 5 encroaches underneath the nitride film 3. As a result, the bird's beaks thus formed cause a non-uniform profile of the semiconductor substrate 1 in major and minor axis directions of the active region. For example, steps are formed along the major axis direction.

The steps formed during the formation of the device isolating layer 5 on the semiconductor substrate 1 will now be explained. FIG. 2 is a plan view showing directions of the bird's beak formation during the formation of the device isolating layer 5, and FIGS. 3a and 3b are sectional views of the semiconductor substrate 1 after an oxide film cleaning.

Referring to FIG. 2, during the formation of the field oxide film 5, a bird's beak effect occurs when the field oxide film 5 encroaches underneath the nitride film 3 in the active region. Here, when the width of the active region is not the same in all directions, i.e., the major and minor axis directions, the different widths of the mask, i.e., the nitride film 3, causes the non-uniform profile of the active region as shown in FIGS. 3a and 3b. The reason is that even though one bird's beak is formed in the minor axis direction, multiple bird's beaks are formed in the major axis direction. To compensate for this reduction of the active region by the abnormal growth of the field oxide film 5, the portion of the field oxide film 5 encroaching into the active region is removed by an oxide film cleaning. The oxide film cleaning is not a selective removal of the field oxide film 5, but an etch back of the field oxide film 5.

In the conventional process for forming a device isolating layer, expansions of the field oxide film in major and minor axis directions through the bird's beak effect are different. Therefore, in order to secure an active region, an oxide film cleaning (mostly in the major axis direction) is conducted to remove the portions of abnormally grown field oxide film. This causes partially different heights ("a" parts in FIG. 3b) in the active region along the major axis direction. In other words, where the oxide film is removed by the oxide cleaning, the height is reduced. The reduced height from the removal of the abnormally grown field oxide film portions, i.e., the portion which is lower than the active region, causes the degradation of $N^-$—$N^-$, $N^+$—$N^+$, and $P^+P^+$ junction space characteristics and the formation of humps. This in turn results in degradation of the device performance.

SUMMARY OF THE INVENTION

Accordingly, the present invention is directed to a method for forming an isolating layer in a semiconductor device that substantially obviates one or more of the problems due to limitations and disadvantages of the related art.

An object of the present invention is to provide a method for forming an isolating layer in a semiconductor device in which the non-uniform reduction of an active region is eliminated.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, the method for forming an isolating layer in a semiconductor device includes the steps of forming a first material layer on an active layer having a major axis and a minor axis, forming a second material layers in a form of sidewall only at sides in a direction of the major axis of the first material layer, and conducting field oxidation using the first and second material layers as masks.

In another aspect, the method for forming an isolating layer in a semiconductor device includes the steps of: defining an active region and a device isolating region, the active region having a major axis direction and a minor axis direction; forming a layer on a first material of the active region; forming sidewalls of a second material at sides of the first layer in the major axis direction; and conducting field oxidation using the layer and the sidewalls as masks to form the isolating layer in the device isolating region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 4:
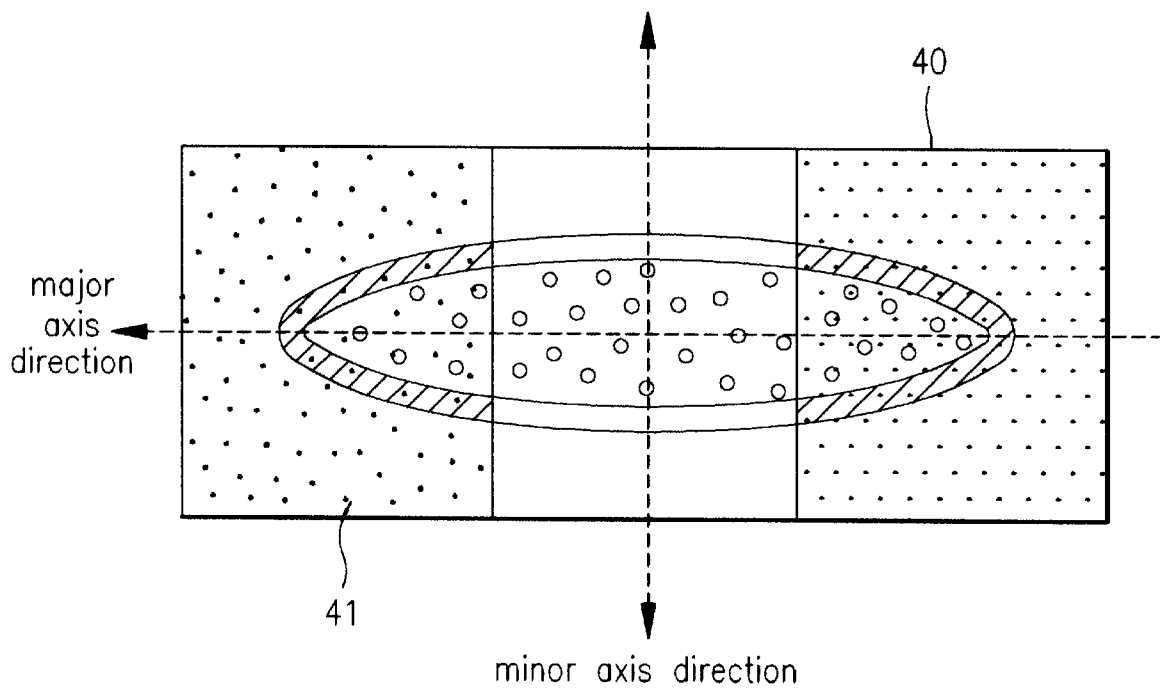
FIG. 4 is a plane view of a device isolating layer in accordance with a preferred embodiment of the present invention.
Figure 4:
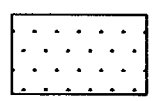
Figure 4:
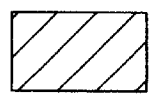
Figure 4:
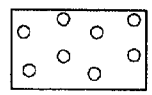
Figure 5A:
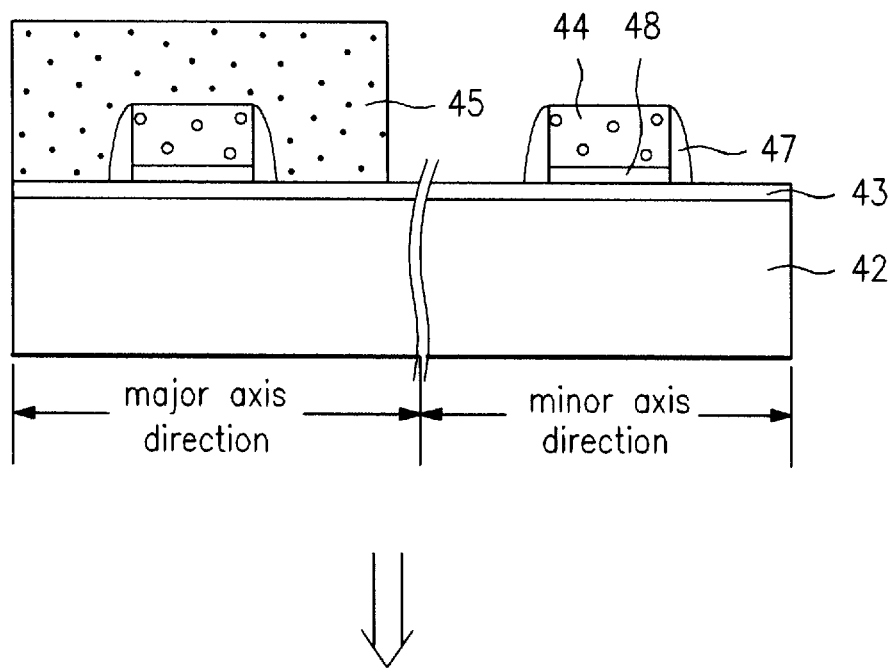
FIGS. 5a and 5b are sectional views showing the steps of a method for forming a device isolating layer in accordance with a preferred embodiment of the present invention.
Figure 5B:
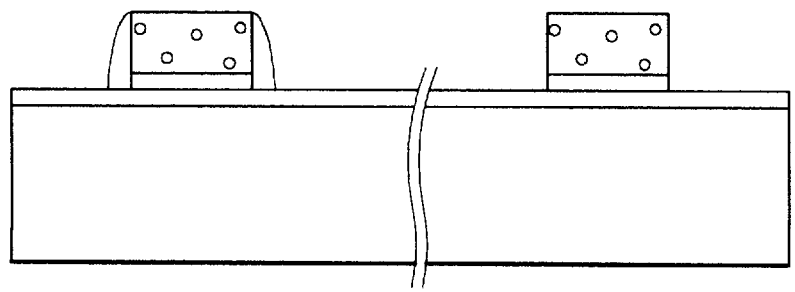

FIG. 4 is a plane view of a device isolating layer in accordance with a preferred embodiment of the present invention. As shown in FIG. 4, the active region is longer in the major axis direction as compared to the minor axis direction. FIG. 5a and FIG. 5b are sectional views showing the steps of a method for forming the device isolating layer in accordance with the preferred embodiment of the present invention.

In the present method for forming a device isolating layer, a field oxide film is grown uniformly in all directions, which would otherwise be grown differently in major and minor axis directions in conventional methods. This eliminates the formation of steps in an active region even after an oxide film cleaning.

Referring to FIGS. 4, 5a and 5b, a buffer oxide film 43 is formed on a semiconductor substrate 42 to be used as an end point for etching. A pad oxide film 48 and a nitride layer 44 for an LOCOS process are then formed on the buffer oxide film 43. Next, a photoresist (not shown) is coated on the entire surface of the structure and patterned to define an active region and a device isolating region. The nitride layer 44 and the pad oxide film 48 are selectively removed using the patterned photoresist as a mask and ions are injected into the device isolation region for prevention of field inversion. A nitride layer is coated again on the entire surface including the patterned nitride layer 44 and then etched back to form nitride sidewalls 47 at sides of the nitride layer 44. The ion injection for prevention of field inversion may be conducted before or after the formation of the nitride sidewalls 47. Then, a photoresist 45 is coated on the entire surface and patterned to selectively remove portions of the photoresist 45 in a minor axis direction of the active region, as shown in FIGS. 4, 5a and 5b, where the nitride layer 44 and the nitride sidewalls 47 are formed. The exposed nitride sidewalls 47 in the active region along the minor axis direction are removed by a dry etch. The photoresist 45 used as a mask is then removed, and a field oxide film to be used as a device isolating film is formed.

Figure 1A:
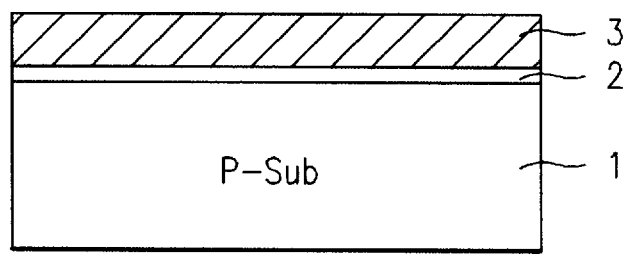
FIGS. 1a~1d are sectional views showing the steps of a general LOCOS process.
Figure 1B:
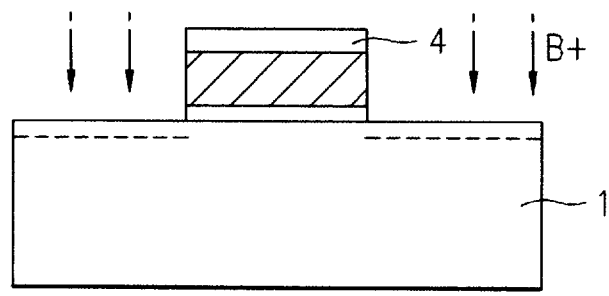
Figure 1C:
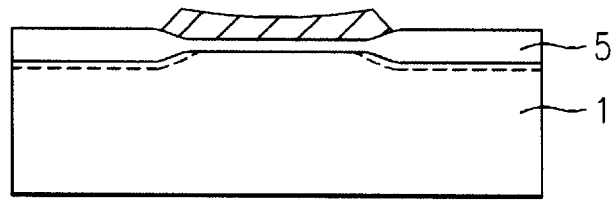
Figure 1D:
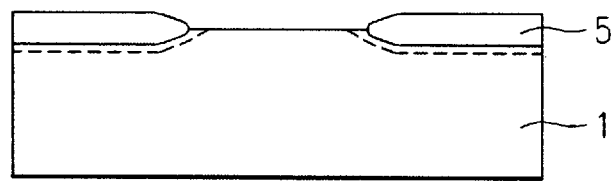
Figure 2:
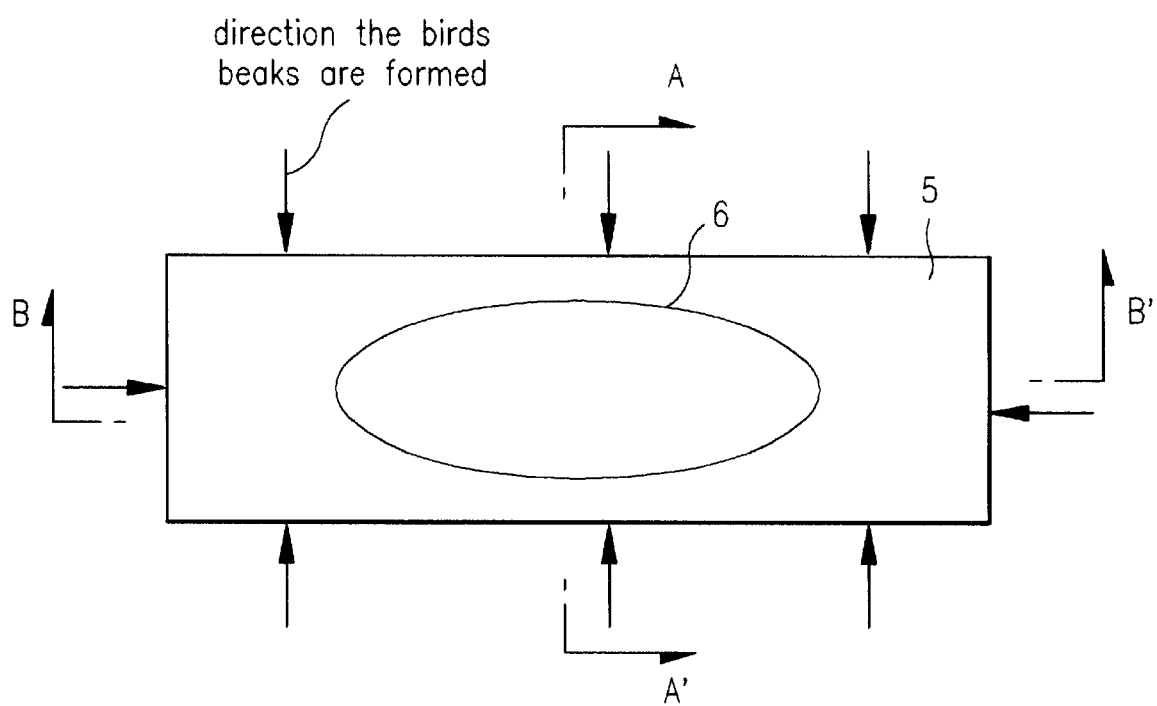
FIG. 2 is a plane view showing directions of bird's beaks formed during the formation of a device isolating layer.
Figure 3A:
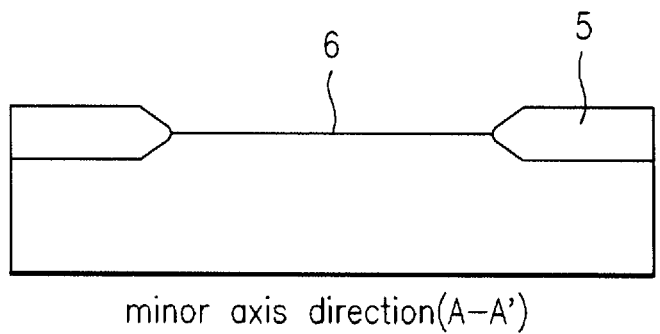
FIGS. 3a and 3b are sectional views of a semiconductor substrate after an oxide film cleaning.
Figure 3B:
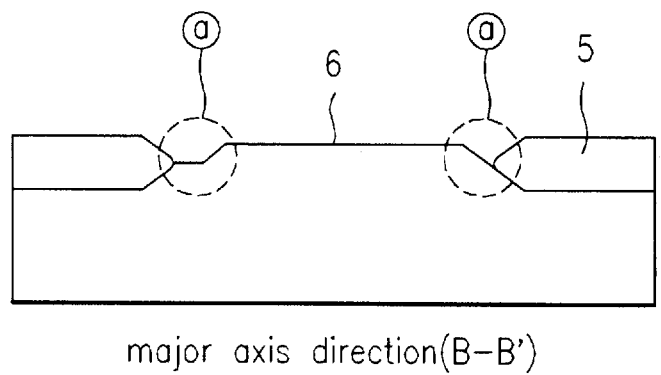
Figure 6:
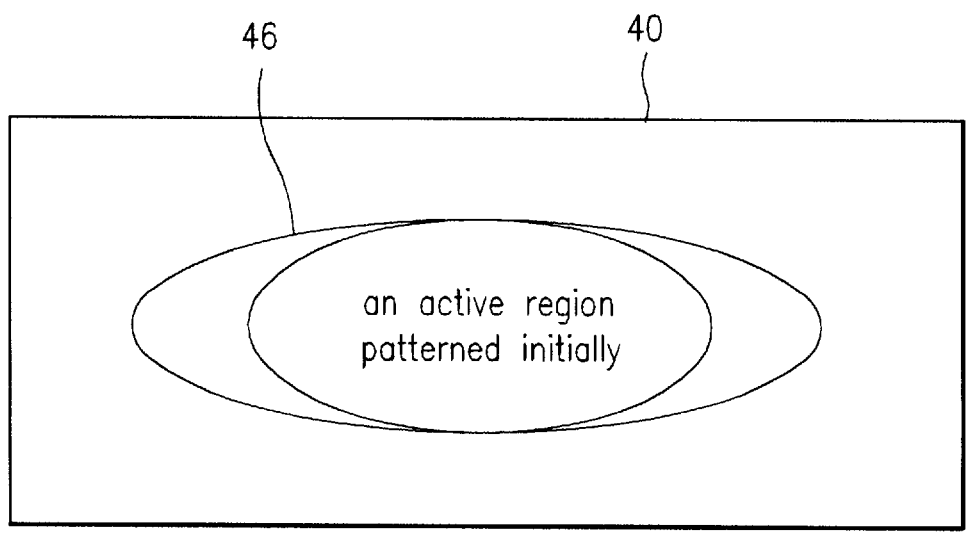
FIG. 6 is a layout view showing an extended active region of the present invention.

By using the aforementioned method for forming an isolating layer in a semiconductor device, the width of the field oxide film can be controlled so that it grows uniformly by means of the nitride sidewalls 47 at sides of the nitride layer 44 formed in the major axis direction. As a result, an extended active region 46, as shown in FIG. 6, can be secured without any undesirable steps (see "a" in FIG. 3b) in the semiconductor substrate 42. In other words, even after the oxide film cleaning for recovering the reduced active region due to the abnormal growth of the field oxide film, no steps are formed in the semiconductor substrate 42. FIG. 6 is a layout view showing such an extended active region of the present invention.

Accordingly, since the method for forming an isolating layer in accordance with the present invention can force the field oxide film to grow uniformly by means of the nitride sidewalls during the formation of the isolating layer, no undesirable steps are formed even after an oxide cleaning. This improves $N^-$—$N^-$, $N^+$—$N^+$, and $P^+$—$P^+$ junction space characteristics and prevents occurrence of humps, thus improving performances of the device.

It will be apparent to those skilled in the art that various modifications and variations can be made in the method for forming a isolating layer in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming an isolating layer in a semiconductor device comprising the steps of:

forming a material layer on an active region of the semiconductor device, the active region having a major axis direction and a minor axis direction, the active region being longer in the major axis direction as compared to the minor axis direction;

forming sidewall spacers at portions of the material layer only in the major axis direction; and conducting field oxidation using the material layer and the sidewall spacers as masks to form the isolating layer.

2. The method as claimed in claim 1, wherein the material layer and the sidewall spacers are formed of a same material.

3. The method as claimed in claim 1, wherein the material layer and the sidewall spacers include a non-oxidizable material.

4. The method as claimed in claim 1, wherein the material layer includes a nitride layer.

5. The method as claimed in claim 1, wherein the sidewall spacers include a nitride layer.

6. A method for forming an isolating layer in a semiconductor device comprising the steps of:

forming a buffer oxide film on a semiconductor substrate;

forming a first nitride layer on the buffer oxide film;

forming a first photoresist layer on the first nitride layer;

patterning the first photoresist layer to leave the first photoresist layer in an active region of the semiconductor device, the active region having a major axis and a minor axis, the active region being longer in the major axis direction as compared to the minor axis direction;

selectively removing the first nitride layer using the patterned first photoresist layer as a mask;

injecting ions into a surface of the semiconductor substrate having the first nitride layer removed therefrom;

forming nitride sidewall spacers at sides of the first nitride layer;

forming a second photoresist layer on the semiconductor substrate, the first nitride layer, and the nitride sidewall spacers;

patterning the second photoresist layer to leave the second photoresist layer only in the active region along the major axis;

removing the nitride sidewall spacers in a direction of the minor axis using the patterned second photoresist layer as a mask;

removing the second photoresist layer; and conducting field oxidation to form the isolating layer in an isolating region of the semiconductor device.

7. The method as claimed in claim 6, wherein the step of injecting ions is conducted after the step of forming the nitride sidewall spacers.

8. The method as claimed in claim 6, wherein the step of removing the nitride sidewall spacers in the direction of the minor axis includes the step of dry etching the nitride sidewall spacers.

9. The method as claimed in claim 6, wherein the step of forming the nitride sidewall spacers includes the steps of:

forming a second nitride layer on the semiconductor substrate and the first nitride layer; and etching back the second nitride layer.

10. A method for forming an isolating layer in a semiconductor device comprising the steps of:

defining an active region and a device isolating region on a substrate of the semiconductor device, the active region having a major axis direction and a minor axis direction, the active region being longer in the major axis direction as compared to the minor axis direction;

forming a layer of a first material on the active region;

forming sidewall spacers of a second material at sides of the layer only in the major axis direction; and conducting field oxidation using the layer and the sidewall spacers as masks to form the isolating layer in the device isolating region.

11. The method as claimed in claim 10, wherein the first material and the second material are the same.

12. The method as claimed in claim 10, wherein the first material and the second material include a non-oxidizable material.

13. The method as claimed in claim 10, wherein the first material includes nitride.

14. The method as claimed in claim 10, wherein the second material includes nitride.

15. The method as claimed in claim 10, wherein the step of forming the layer of the first material includes forming a buffer oxide film and a nitride layer sequentially on the semiconductor substrate.

16. The method as claimed in claim 10, further comprising the step of injecting ions into a surface of the substrate before forming the sidewall spacers.

17. The method as claimed in claim 10, further comprising the step of injecting ions into a surface of the substrate after forming the sidewall spacers.

18. The method as claimed in claim 10, wherein the step of forming sidewall spacers in the major axis direction includes the steps of:

forming a nitride layer on the substrate and the layer of the first material;

etching back the nitride layer to form sidewall spacers at the sides of the layer of the first material;

forming a photoresist layer selectively in the active region along the major axis direction;

removing the sidewall spacers in the minor axis direction using the photoresist layer as a mask; and removing the photoresist layer.

19. The method as claimed in claim 18, wherein the sidewall spacers in the minor axis direction are removed by dry etching.

* * * * *